(12) United States Patent
Hon et al.

(10) Patent No.: US 7,091,544 B2
(45) Date of Patent: Aug. 15, 2006

(54) TRENCH CAPACITOR DYNAMIC RANDOM ACCESS MEMORY FEATURING STRUCTURALLY INDEPENDENT SYMMETRIC ACTIVE AREAS

(75) Inventors: Rui-Yuan Hon, Hsinchu (TW); Tony Chien, Hsinchu (TW)

(73) Assignee: Promos Technologies Inc. (TW)

( * ) Notice: Subject to any disclaimer, the term of this patent is extended or adjusted under 35 U.S.C. 154(b) by 0 days.

(21) Appl. No.: 10/980,225

(22) Filed: Nov. 4, 2004

(65) Prior Publication Data

US 2006/0076601 A1 Apr. 13, 2006

(30) Foreign Application Priority Data

Oct. 7, 2004 (TW) ............... 93130402 A

(51) Int. Cl.
*H01L 27/108* (2006.01)
(52) U.S. Cl. ............... 257/301; 257/905; 257/E27.084
(58) Field of Classification Search ............... 257/296; 438/238, 239, 386, 399
See application file for complete search history.

(56) References Cited

U.S. PATENT DOCUMENTS

| 6,278,149 | B1 * | 8/2001 | Sato et al. ............... 257/301 |
| 2003/0001180 | A1 * | 1/2003 | Narimatsu et al. .......... 257/296 |
| 2005/0070066 | A1 * | 3/2005 | Gutsche et al. ............. 438/243 |

* cited by examiner

*Primary Examiner*—Eddie Lee
*Assistant Examiner*—Andrew O. Arena

(57) ABSTRACT

A dynamic random access memory structure is provided, each active area of a memory unit cell is distributed individually in a substrate, and deep trench patterns are designed to have a checkerboard-like arrangement in the substrate. Also, there is a constant space between each deep trench pattern in a row. Further, long bit line contact plugs are located to electrically connect active areas of two diagonally neighbor memory unit cells, and a contact hole is formed on each long bit line contact plug to enable bit lines contact the long bit line contact plugs so two diagonally neighbor memory unit cells are controlled by the same bit line.

14 Claims, 9 Drawing Sheets

TRENCH CAPACITOR DYNAMIC RANDOM ACCESS MEMORY FEATURING STRUCTURALLY INDEPENDENT SYMMETRIC ACTIVE AREAS

RELATED APPLICATIONS

The present application is based on, and claims priority from, Taiwan Application Serial Number 93130402, filed Oct. 7, 2004, the disclosure of which is hereby incorporated by reference herein in its entirety.

BACKGROUND OF THE INVENTION

1. Field of Invention

The invention relates to a dynamic random access memory structure and, in particular, to a dynamic random access memory structure with checkerboard-like deep trench patterns to increase the density of devices.

2. Related Art

Dynamic random access memory (DRAM) devices are widely used in integrated circuits (IC) of the electronic industry for binary data access. As the densities of the semiconductor circuits become higher, the sizes of semiconductor devices also have to decrease. Therefore, the capacitor design in DRAM in recent years turns to three-dimensional in order to satisfy the strict requirement in current leaking that happens to small-size devices. Some even design the DRAM memory unit cell into one that consists of vertical transistors in deep trenches (DT) and DT capacitors in order to effectively increase the device density.

Although vertical transistors and DT capacitor structures can increase the memory unit cell density in the DRAM, the DT patterns are further designed to have a mirror-type symmetric structure (see FIG. 1) in order to further save the layout space.

As shown in FIG. 1, the substrate 100 is formed with an active area 102, DT patterns 104, and bit line contact holes 106. The vertical arrangement of the DT patterns 104 is in the word line direction, while the horizontal arrangement is in the bit line direction. A shallow trench isolation region 108 is provided between each two active areas 102 as electrical insulation. A feature of this conventional structure is that a memory unit cell 111 and its neighbor memory unit cell 112 have a mirror-type DT pattern 104 to form a mirror-type device symmetric structure. The memory unit cells 111, 112 share one contact hole 106.

Therefore, the DRAM device with mirror-symmetric DT patterns uses the feature that two neighboring memory unit cells share one contact hole 106 to effectively save layout space. However, some of the DT patterns 104 are so close that are connected to form short-circuit defects during the manufacturing process, deteriorating the quality of the devices. This type of DT short-circuit defects 110 is more serious as the aspect ratio of the DT patterns 104 increases.

Therefore, how to let the memory unit cells keep sharing contact holes and at the same time prevent the DT short-circuit defects from happening is important for the production of DRAM devices with higher densities.

SUMMARY OF THE INVENTION

An objective of the invention is to provide a DT pattern with a checkerboard arrangement for DRAM in order to enlarge the process tolerant in making devices. Using the design of bit line contact plugs, memory unit cells of diagonal neighbors share one bit line contact plug. It is suitable for fabricating memory devices with small sizes and high densities.

According to the objective, the invention provides a DRAM structure. According to a preferred embodiment, the disclosed DRAM includes a plurality of active areas, a plurality of deep trenches, a plurality of long bit line contact plugs, a plurality of word lines, and a plurality of bit lines. Each of the active area is individually distributed in a substrate to form a horizontal array. Each of the deep trenches is disposed on a corresponding active area to form a memory unit cell region. The deep trenches have a checkerboard-like arrangement. Each pair of adjacent deep trenches is maintained at a fixed distance. In particular, diagonally neighbor memory unit cell regions have a mirror structure.

The long bit line contact plugs are designed to be above and in contact with the active area. In particular, each of the long bit line contact plugs connects two diagonally neighbor active areas, thereby connecting the corresponding memory unit cell regions.

Each of the word lines is in the vertical array above the active area. Each adjacent two word lines cross and overlap with an active area. The bit line passes over and gets into contact with a long bit line contact plug. The bit lines and the word lines form a crossing array.

Besides, an insulating layer can be formed on the long bit line contact plugs. Contact holes are then formed in the insulating layer to expose each of the long bit line contact plugs. The size of the contact holes is smaller than the long bit ling contact plugs and does not overlap with the locations of the active area. The contact holes are formed for the long bit line contact plugs to be in contact with the bit lines passing over them, establishing electrical communications with the active area. The insulating layer is used to block a long bit line contact plug from another long bit line contact plug passing its neighbor bit line, thereby avoiding short circuiting.

According to another embodiment of the invention, the DRAM includes at least a plurality of stripe-like active areas, a plurality of deep trenches, a plurality of collar oxide layers, a plurality of long bit line contact plugs, a plurality of word lines, and a plurality of bit lines. The stripe-like active areas are in a substrate. Each of the stripe-like active areas has a plurality of memory unit cell regions connected in structure. Each deep trench is in the corresponding memory unit cell region. The deep trenches are symmetric with respect to stripe-like active areas. The deep trenches in an odd-numbered row are symmetric to those in another odd-numbered row. They form a checkerboard-like pattern on the substrate. The neighbor deep trenches in each same row are separated by a fixed distance.

In this embodiment, the collar oxide layer is formed on the upper half inner border of each deep trench. Each collar oxide layer is designed to have a first collar portion and a second collar portion, with the former being higher than the latter. The first collar portion electrically insulates the memory unit cell regions connected in structure.

The formation of the first collar portion and the second collar portion can be done by using a photo resist mask pattern and performing an etching process on the collar oxide layer, removing part of each collar oxide layer to a certain depth. The part being removed to a certain depth becomes the second collar portion. The part that is protected by the photo resist mask from being removed is the first collar portion.

This embodiment also has long bit line contact plugs to connect two diagonally neighbor memory unit cell regions. Therefore, each long bit line contact plug crosses over and gets into contact with two neighbor rows of stripe-like active areas.

In addition, the word lines form a vertical array above the stripe-like active areas. Each two adjacent word lines cross and overlap with a corresponding memory unit cell. The bit line passes over and gets into contact with a long bit line contact plug. The word lines and the bit lines form a crossing array.

The combination of a checkerboard-like deep trench arrangement and the a long bit line contact plug structure of the invention still keeps the layout advantage that two memory unit cells share the same bit line contact plug. Moreover, the neighbor deep trenches are separated by a fixed distance to effectively prevent the deep trench patterns from short circuiting.

Furthermore, the invention uses a photo resist mask pattern for a collar oxide layer in a deep trench to have different heights. The collar portion with a larger height is used to prevent a subsequently formed buried strap conductor layer from getting into contact with its neighbor active area. Thus, it achieves the effect of electrically insulating the active areas of the memory unit cells. Therefore, the invention can improve or avoid the problem of bad active area definitions when the device density and the process freedom requirement increase. The memory product yield and reliability can also be promoted.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

The disclosed dynamic random access memory (DRAM) structure and the fabrication method thereof make use of a checkerboard-like deep trench (DT) pattern layout design to keep adjacent DT at a fixed distance and thus effectively avoid short circuiting. With the design of long bit line contact plugs, two memory unit cells are connected to share the same bit line contact plug. We use the following embodiment to describe the disclosed method in detail.

Embodiment 1

Figure 1:
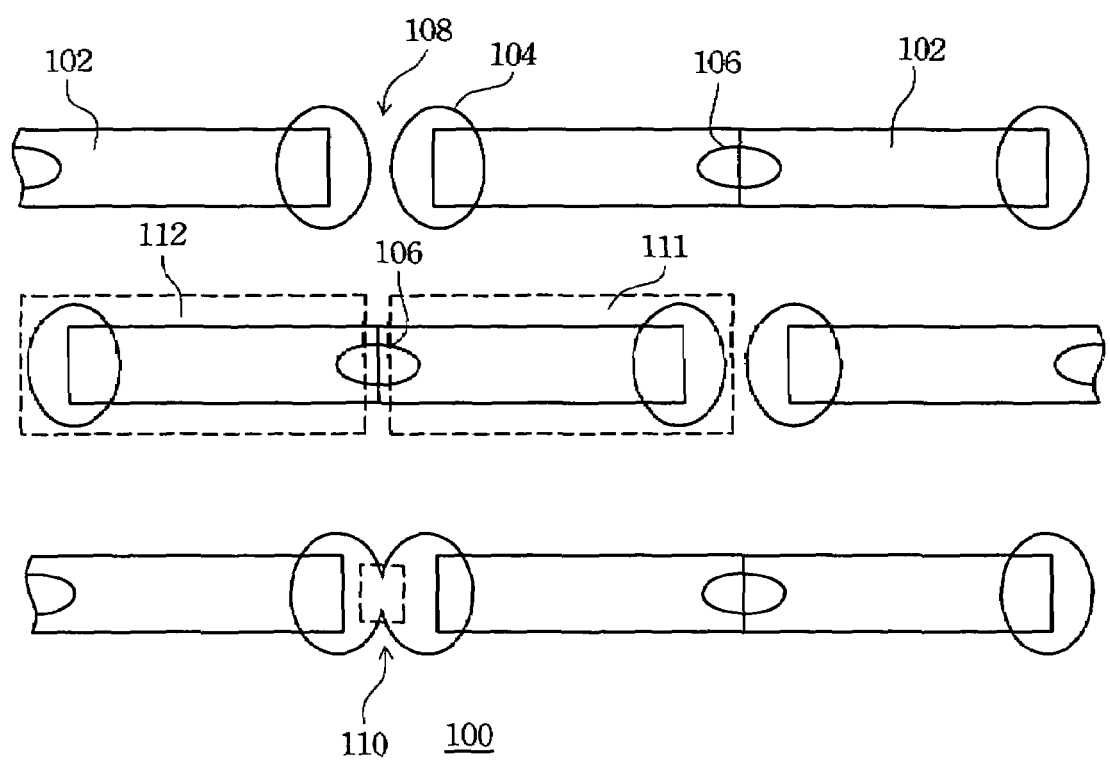
FIG. 1 is a top view of part of the substrate surface in a conventional DRAM device with mirror-symmetric DT patterns.
Figure 2A:
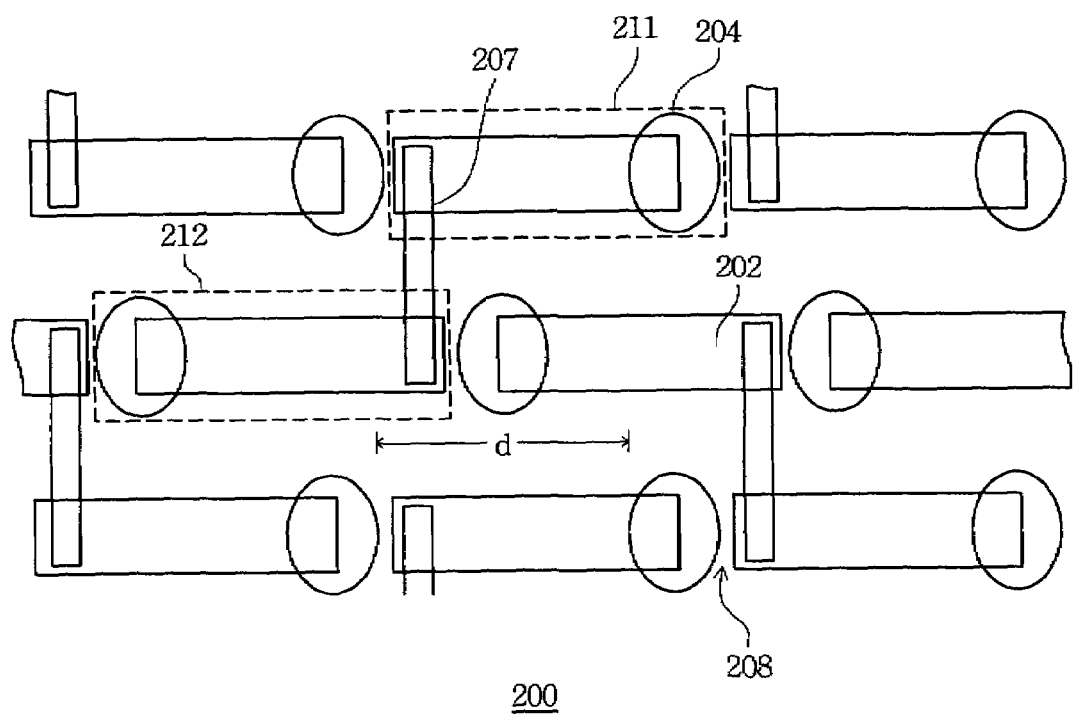
FIG. 2A is a top view of part of the substrate surface in the DRAM device according to the first embodiment of the invention.

The surface part of the substrate of a DRAM device according to a first embodiment of the invention is shown in the FIG. 2A.

First, the invention separates active areas with a mirror connection design of the conventional memory unit cells, forming dislocations as shown in FIG. 2A. The substrate 200 has independent active areas 202. The DT patterns 204 have a checkerboard-like arrangement on the active areas 202. The active area 202 is made of a P-type silicon substrate as a lower electrode. The interior of the DT pattern 204 is a capacitor structure. Two diagonally neighbor memory unit cells are designed to share a contact plug, thereby electrically connected to the same bit line. For example, in this embodiment a long bit line contact plug 207 is used to connect each memory unit cell 212 to its upper-right neighbor memory unit cell 211.

The memory unit cells 211 and 212 are mirror images of each other. The design of a long bit line contact plug 207 is used to connect the memory unit cells 211, 212. A shallow trench isolation (STI) 208 is used to electrically insulate two neighbor active areas 202.

Through the arrangement of the above-mentioned checkerboard-like DT pattern 204 whose neighbor DT patterns 204 are kept at a distance d, the neighbor DT are avoided from getting too close and short circuiting. Moreover, the embodiment uses the long bit line contact plugs 207 to connect memory unit cells 211, 212 whose active areas 202 are not connected.

Figure 2B:
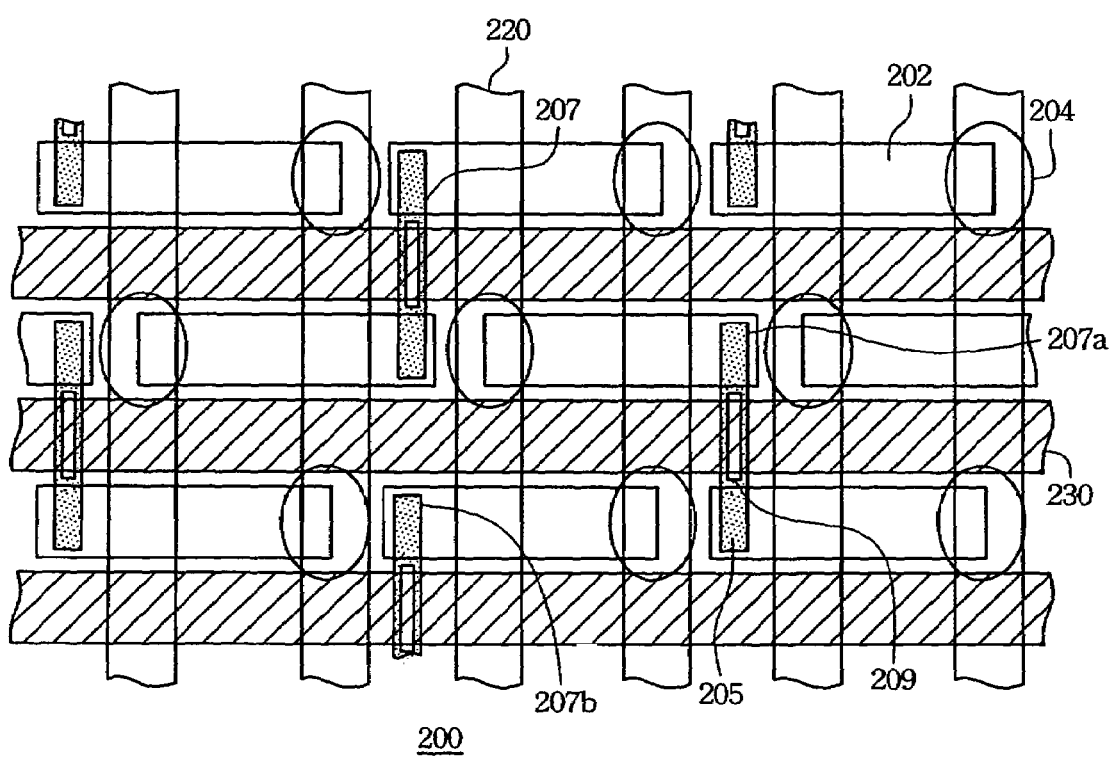
FIG. 2B is a top view of part of the layout in the DRAM device according to the first embodiment of the invention.

FIG. 2B is a top view of part of the DRAM structure in the first preferred embodiment. It shows the complete layout with the word lines and bit lines added to FIG. 2A.

In FIG. 2B, the word lines 220 form a vertical array passing the DT patterns 204. The bit lines 230 form a horizontal array also passing the DT patterns 204 and in electrical communications with the long bit line contact plugs 207.

From FIG. 2B, the locations of the bit lines 230 are in the vicinity of their adjacent horizontal long bit line contact plugs 207. Therefore, the long bit line contact plugs 207 in different rows are likely to form short circuits via the bit lines 230. For example, a long bit line contact plug 207a and its adjacent horizontal long bit line contact plug 207b should be electrically independent. However, the bit line 230 that passes the long bit line contact plug 207a is very close to the long bit line contact plug 207b. Thus, there may be partial overlap between them due to the restriction of the manufacturing process, resulting in short circuiting between the long bit line contact plug 207a and the long bit line contact plug 207b.

To avoid such short circuiting problems among the long bit line contact plugs 207, an insulating layer, such as silicon nitride, is first coated on the long bit line contact plugs 207 in this embodiment. Contact holes 209 with a size smaller than the long bit line contact plugs 207 are then formed thereon. In particular, the long bit line contact plugs 207 are used to connect the active areas of those memory unit cells to be connected. The contact holes 209 are used to connect the bit lines 230 and the long bit line contact plugs 207, so that each bit line 230 is connected to its diagonal neighbor memory unit cell via the contact hole 209. The region 205 above the long bit line contact plugs 207 other than the contact holes 209 is covered by the insulating layer.

Since the size of the contact hole 209 is obviously smaller than the long bit line contact plug 207, the layout of the bit lines 230 can hardly overlap with the contact holes 209 but only the region 205. Therefore, even if the bit lines 230 in the layout have some overlap with the long bit line contact plugs 207 in the horizontal rows, the insulating layer in the region 205 can effectively block the bit lines 230 from their adjacent long bit line contact plugs 207 to prevent short circuiting.

Embodiment 2

Figure 3:
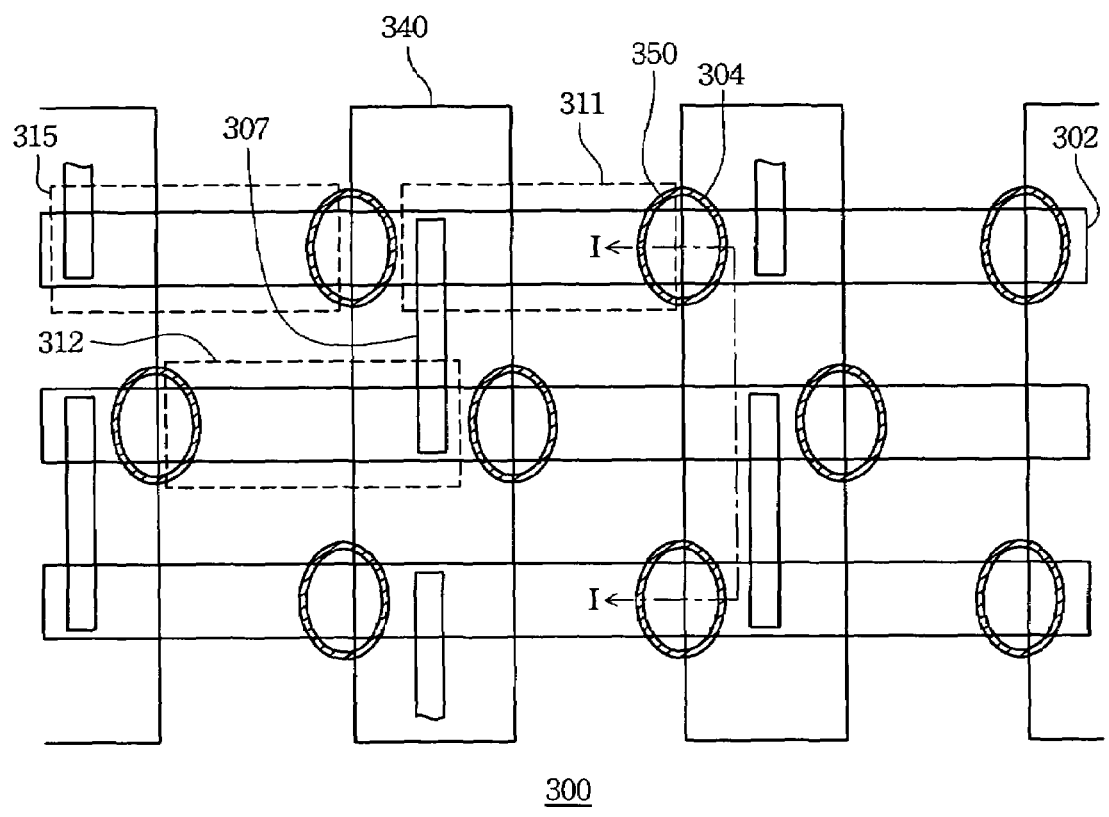
FIG. 3 is a top view of part of the substrate surface in the DRAM device according to the second embodiment of the invention.

The invention further discloses another DRAM structure. FIG. 3 shows the top view of part of the DRAM device substrate surface in the second embodiment of the invention.

As shown in the drawing, the substrate 300 has the design of stripe-like active areas 302 in addition to the checkerboard-like DT patterns 304. In this embodiment, each memory unit cell in the same stripe-like active area 302 is not defined with an independent active area (as shown in FIG. 2A). Instead, an collar oxide layer photo resist mask 340 is employed to form collar oxide layers 350 of different heights in the DT patterns 304, thereby separating the active areas of the memory unit cells.

Figure 4A:
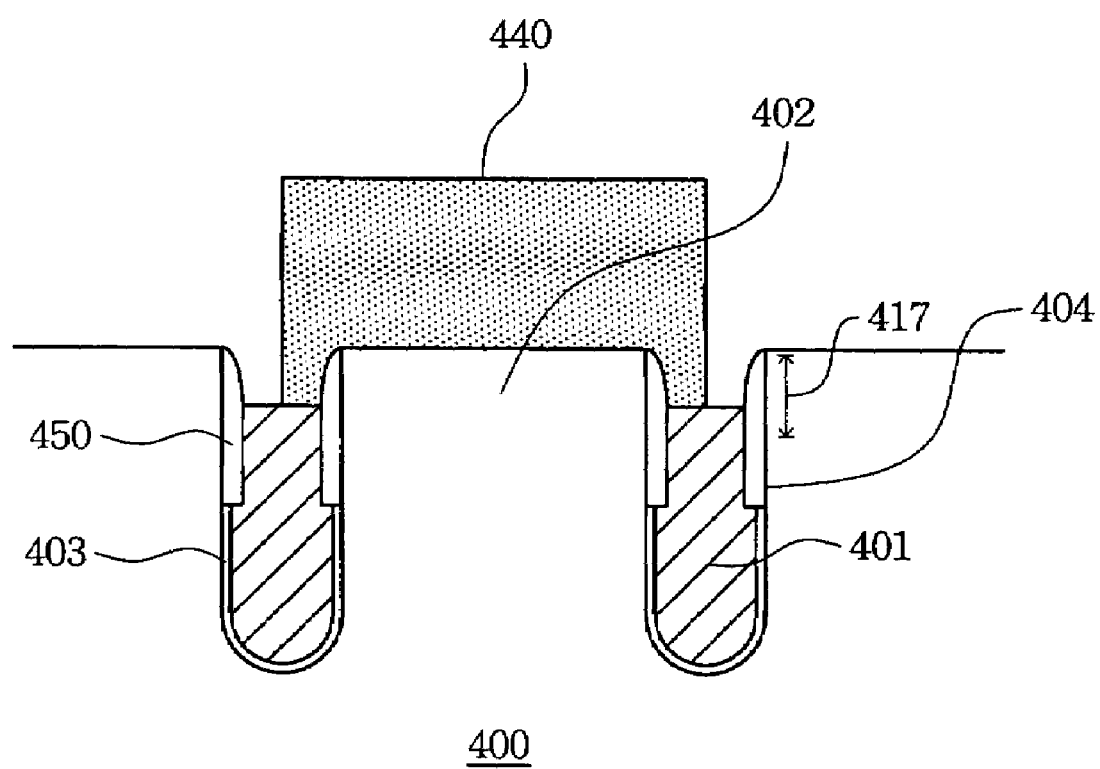
FIGS. 4A and 4B are schematic cross-sectional views of fabricating collar oxide layers in the DT structure of a DRAM device according to the second embodiment of the invention.
Figure 4B:
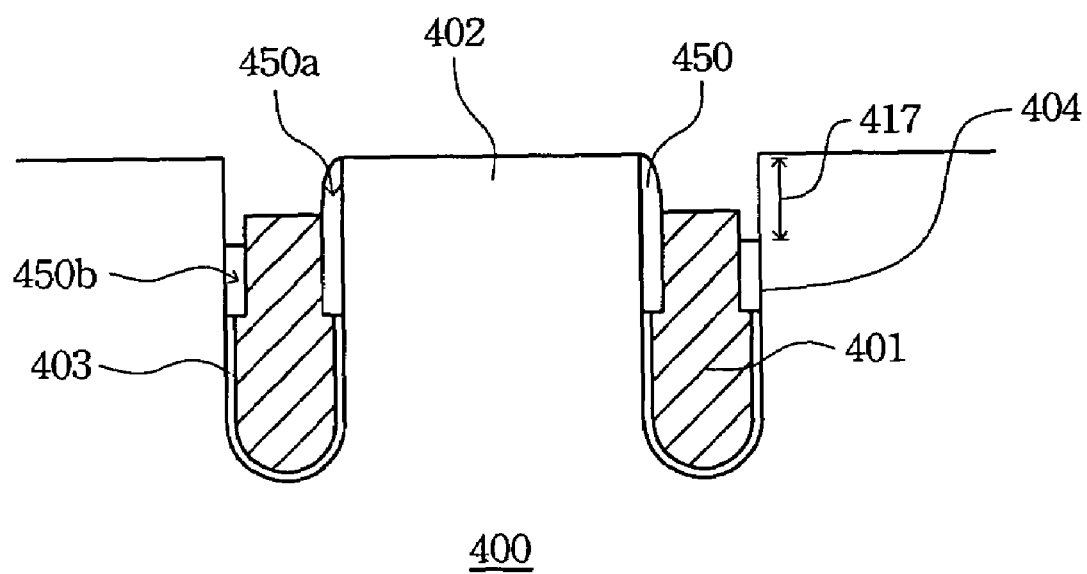

FIGS. 4A and 4B are schematic cross-sectional views of how to make collar oxide layers in the DT patterns of a DRAM device. They show the cross section along the I—I line of FIG. 3.

In FIG. 4A, the substrate 400 has DT 404 and active areas 402. An upper electrode layer 401 is provided in the DT 404. A dielectric layer 403 and an collar oxide layer 450 with the capacitance function are provided between the sidewall of the DT 404 and the upper electrode layer 401. Originally, the collar oxide layers 450 formed inside the DT 404 have the same height. However, after forming the collar oxide layer 450, a collar oxide layer mask pattern is used to form an collar oxide layer photo resist mask 440 (the photo resist mask 340 in FIG. 3) to cover half of the collar oxide layer 450. Afterwards, ordinary subsequent collar oxide layer etching is performed.

In the step of etching the collar oxide layer 450, only the collar oxide layer 450 not covered by the photo resist mask 440 is removed to a certain depth 417. The collar oxide layer 450 protected by the photo resist mask 440 is preserved. Therefore, one obtains a structure as in FIG. 4B. As shown in the drawing, both sides of the DT 404 have collar oxide layers 450 of different heights. The collar oxide layer 450a is higher than the collar oxide layer 450b.

When a buried strap conductor is formed in the DT 404 in the subsequent processes, the higher collar oxide layer 450a prevents the buried strap conductor from being in contact with its adjacent active area 402. Thus, the invention achieves the effect of insulating the active areas of all memory unit cells.

With further reference to FIG. 3, each memory unit cell 311 and its diagonal neighbor memory unit cell 312 are connected via the long bit ling contact plug 307. However, both of them should be blocked from its horizontal neighbor memory unit cells. This embodiment uses an collar oxide layer photo resist mask 340 to maintain part of the collar oxide layer 350 in the DT pattern 304 at a fixed height (as the collar oxide layer 450a shown in FIG. 4B). This configuration can electrically insulate the active areas of all the memory unit cells, such as the memory unit cell 311 and the memory unit cell 315.

Besides the manufacturing process described above, one can use another method shown in FIGS. 5A to 5C.

Figure 5A:
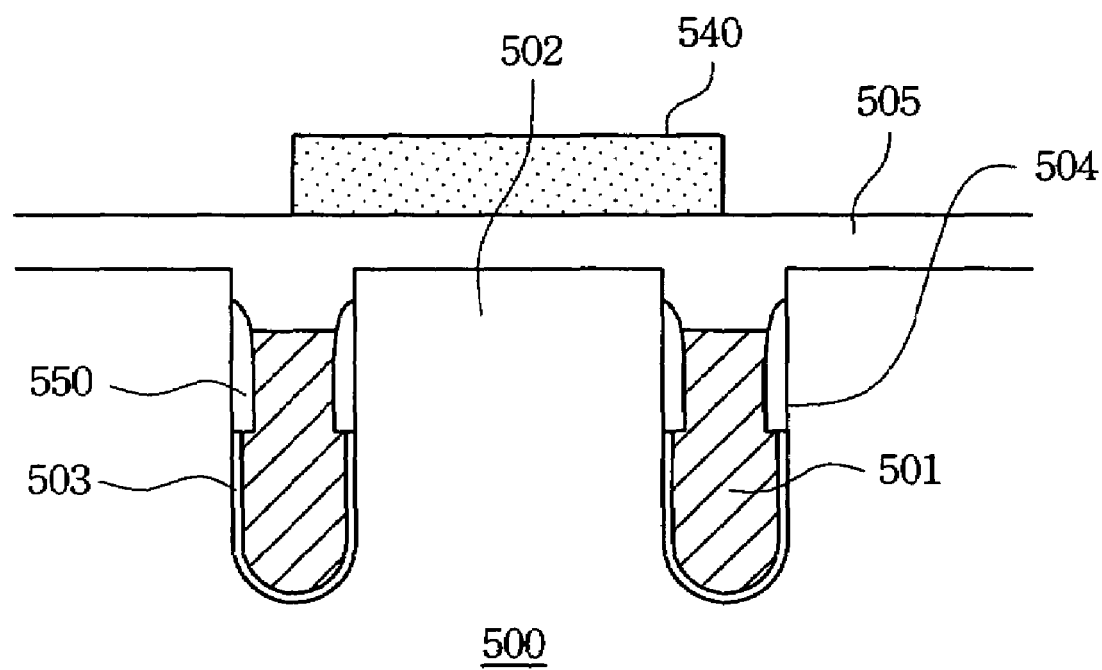
FIGS. 5A to 5C are schematic cross-sectional view of fabricating collar oxide layers in the DT structure of another DRAM device according to the second embodiment of the invention.

In FIG. 5A, the substrate 500 also has DT 504, active areas 502, upper electrode layers 501, dielectric layer 503, and collar oxide layers 550. However, it is different from FIG. 4A in that the strap conductor layer 505 is first formed to cover the active areas 502 and the DT 504 before the collar oxide layer 550 is partially removed. The strap conductor layer 505 can be formed by depositing As-doped polysilicon accompanied by chemical mechanical polishing (CMP). Afterwards, a photo resist mask 540 (whose pattern is defined at the mirror position of the photo resist mask 340 in FIG. 3) to cover part of the active areas 502 and half the DT 504. Then an etching is done to the strap conductor layer 505 and the upper electrode layer 501.

Figure 5B:
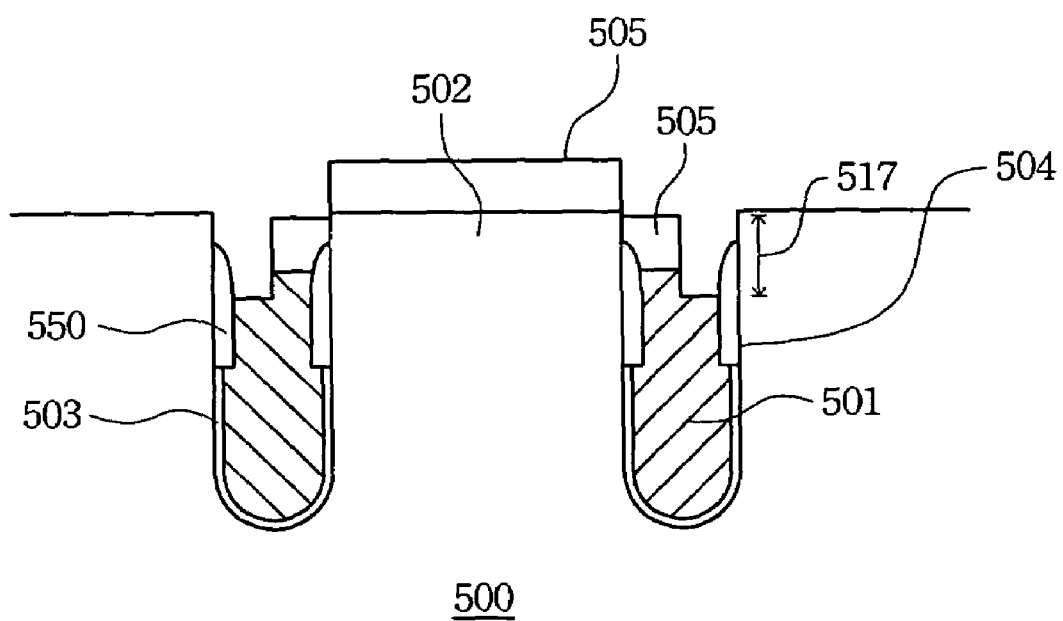

In the end, the structure shown in FIG. 5B is formed. Through two etching steps, the strap conductor layer 505 in half DT 504 is removed. Afterwards, part of the lower electrode layer 501 underneath is removed to expose half the collar oxide layer 550 to a certain depth 517. Moreover, recessing is performed on the strap conductor layer 505 above the other half collar oxide layer 550 so that it is lower than the active area 502.

Figure 5C:
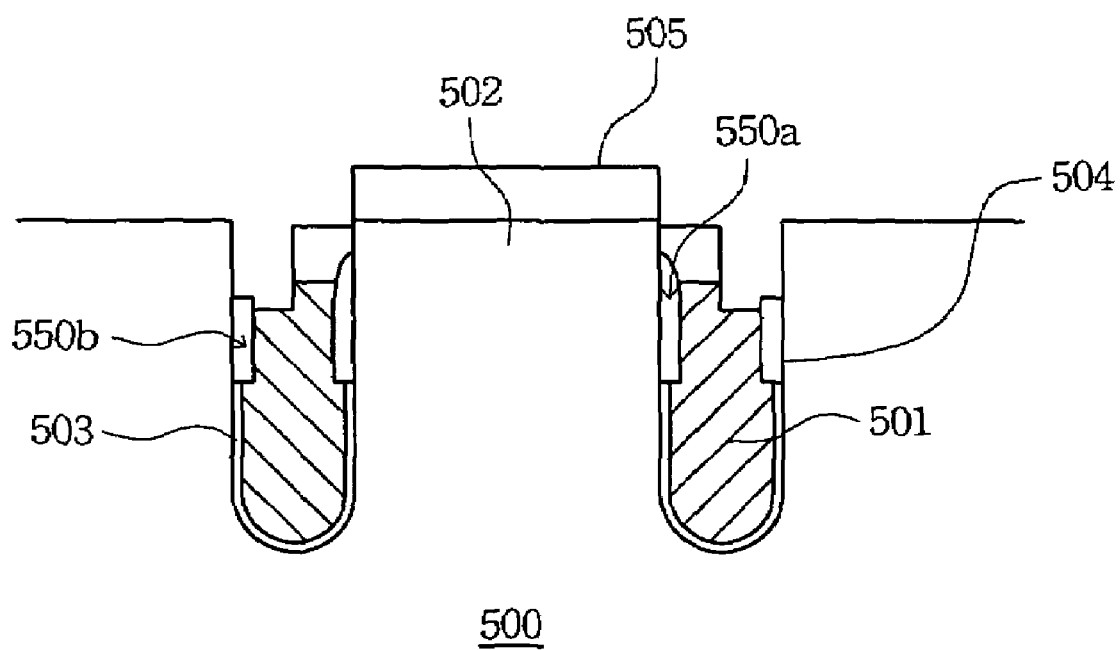

Finally, the exposed half collar oxide layer 550 is directly etched to form a structure shown in FIG. 5C. In the drawing, the exposed collar oxide layer 550b is removed to a certain depth. The collar oxide layer 550a covered by the strap conductor layer 505 is completely preserved. The collar oxide layer 550b formed according to the above-mentioned process is used to insulate the active area of the memory unit cells.

According to the design in the disclosed second embodiment, there is no need to define the active area in advance. Therefore, one directly uses the stripe-like active area structure and the improved collar oxide layer to achieve active area insulation. As the density increases, the active area definition may be imperfect because the requirement of freedom in manufacturing processes gets higher. Short circuiting may thus occur to the active areas. Using the design of the disclosed second embodiment can effectively prevent the short circuiting problem due to imperfect active area definitions.

In summary, the embodiments disclosed herein combine the checkerboard-like DT pattern and the long bit line contact plug structure to maintain the layout advantage of the sharing bit line contact plugs among memory unit cells and to effectively prevent the DT patterns from short circuiting. Moreover, the invention further uses collar oxide layer photo resist masks to form collar oxide layers of different heights within the same DT. This structure prevents the buried strap conductor layer from direct contact with its adjacent active area. Thus, the invention achieves the effect of insulating the active areas of all the memory unit cells.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A dynamic random access memory (DRAM) structure, comprising:
 a plurality of active areas in a substrate and disposed into a horizontal array, wherein each of the active areas is structurally independent;
 a plurality of deep trenches (DT), wherein each of the DT is located in the substrate of the corresponding active area and the DT form a checkerboard-like arrangement with adjacent DT in the same row being kept at a fixed distance;

a plurality of long bit line contact plugs above the active areas and in contact with the active areas; wherein each of the long bit line contact plugs is connected to two of the diagonally neighbor active areas;

a plurality of word lines above the active areas, wherein the word lines form a vertical array and each of the active areas crosses each two of the word lines;

a plurality of bit lines passing above and in contact with the long bit line contact plugs;

wherein the bit lines and the word lines form a crossing array;

an insulating layer on the long bit line contact plugs; and a plurality of contact holes in the insulating layer and on each of the long bit line contact plugs to expose the long bit line contact plugs for electrical communications with part of the bit lines; wherein the size of the contact holes is smaller than that of the long bit line contact plugs and the contact holes do not overlap with the active areas.

2. The DRAM structure of claim 1, wherein the substrate is a silicon substrate.

3. The DRAM structure of claim 1, wherein each of the active areas is a memory unit cell region and each of the memory unit cell regions and its diagonal neighbor memory unit cell region have a mirror structure.

4. The DRAM structure of claim 1, wherein the active areas form a horizontal array and have a symmetric structure every other row, the active areas in an odd-numbered row being symmetric to the active areas in another odd-numbered row.

5. The DRAM structure of claim 4, wherein the DT are symmetric every other row with respect to the horizontal array to form a checkerboard-like arrangement.

6. The DRAM structure of claim 1, wherein the DT has a capacitor structure.

7. The DRAM structure of claim 6, wherein the capacitor structure in the DT includes an upper electrode layer, a dielectric layer, and a collar oxide layer.

8. A dynamic random access memory (DRAM) structure, comprising:

a plurality of stripe-like active areas in a substrate, wherein each of the stripe-like active areas contains several a plurality of memory unit cell regions connected in structure;

a plurality of deep trenches (DT) in the substrate of the memory unit cell regions, wherein each of the DT on an odd-numbered row of the stripe-like active area is symmetric to the DT on another odd-numbered row, the DT form a checkerboard-like arrangement, and the adjacent DT in the same row are kept at a fixed distance;

a plurality of collar oxide layers, wherein some of the collar oxide layers are on the upper half inner border of the DT, each of the collar oxide layers has a first collar portion and a second collar portion with the former higher than the latter plus the height of an upper electrode layer, and the first collar portion is used to electrically insulate the memory unit cell regions connected in structure;

a plurality of long bit line contact plugs; wherein each of the long bit line contact plugs crosses over and contacts with two rows of the stripe-like active areas and each of the long bit line contact plugs is connected to two of the diagonally neighbor memory unit cell regions;

a plurality of word lines above the stripe-like active areas, wherein the word lines form a vertical array and each of the memory unit cell regions crosses each two of the word lines;

a plurality of bit lines passing above and in contact with the long bit line contact plugs; wherein the bit lines and the word lines form a crossing array;

an insulating layer on the long bit line contact plugs; and a plurality of contact holes in the insulating layer and on each of the long bit line contact plugs to expose the long bit line contact plugs for electrical communications with part of the bit lines; wherein the size of the contact holes is smaller than that of the long bit line contact plugs and the contact holes do not overlap with the active areas.

9. The DRAM structure of claim 8, wherein the substrate is a silicon substrate.

10. The DRAM structure of claim 8, wherein the DT has a capacitor structure.

11. The DRAM structure of claim 10, wherein the capacitor structure in the DT includes an upper electrode layer, a dielectric layer, and a collar oxide layer.

12. The DRAM structure of claim 11, wherein the upper electrode layer is a polysilicon layer.

13. The DRAM structure of claim 8, wherein the DT contains a buried strap conductor layer on the upper electrode layer, the first collar portion of the collar oxide layer being between the buried strap conductor layer and the stripe-like active area to electrically insulate the memory unit cell regions.

14. The DRAM structure of claim 8, wherein a photo resist mask is used to etch the collar oxide layer, removing part of the collar oxide layer to a certain depth to form the second collar portion and the unremoved part of the collar oxide layer protected by the photo resist mask being the first collar portion.

* * * * *